US006476489B1

United States Patent
Yoo et al.

(10) Patent No.: US 6,476,489 B1
(45) Date of Patent: Nov. 5, 2002

(54) APPARATUS AND MANUFACTURING METHOD FOR SEMICONDUCTOR DEVICE ADOPTING NA INTERLAYER CONTACT STRUCTURE

(75) Inventors: Bong-young Yoo, Seoul (KR); Dae-hong Ko, Seoul (KR); Nae-in Lee, Suwon (KR); Young-wook Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/258,292

(22) Filed: Feb. 26, 1999

Related U.S. Application Data (63) Continuation of application No. 08/571,372, filed on Dec. 13, 1995.

(30) Foreign Application Priority Data

Dec. 14, 1994 (KR) .............................. 94-34250

(51) Int. Cl.⁷ .............................. H01L 23/48
(52) U.S. Cl. .................. 257/754; 257/754; 257/755; 257/756; 257/905; 257/906; 257/907; 257/908
(58) Field of Search .................. 257/754, 755, 257/756, 905, 906, 907, 908

(56) References Cited

U.S. PATENT DOCUMENTS

| | | | |
|---|---|---|---|
| 3,777,364 A | 12/1973 | Schinella et al. | 29/578 |
| 4,329,706 A | 5/1982 | Crowder et al. | 357/71 |
| 4,398,335 A | 8/1983 | Lehrer | 29/577 |
| 4,507,852 A | 4/1985 | Karulkar | 29/590 |
| 4,556,897 A | 12/1985 | Yorikane et al. | 357/71 |
| 4,663,825 A | 5/1987 | Maeda | 29/517 |
| 4,751,198 A | 6/1988 | Anderson | 437/200 |
| 4,754,318 A | 6/1988 | Momose et al. | 357/71 |
| 4,887,143 A | 12/1989 | Okamoto et al. | 357/49 |
| 4,888,306 A | 12/1989 | Komatsu et al. | 437/162 |
| 4,943,539 A | 7/1990 | Wilson et al. | 437/195 |
| 4,948,459 A | 8/1990 | van Laarhoven et al. | 156/643 |
| 5,480,837 A | 1/1996 | Liaw et al. | 437/193 |
| 5,519,254 A | 5/1996 | Tabara | 257/751 |
| 5,619,071 A | 4/1997 | Myers et al. | 257/753 |
| 5,736,770 A * | 4/1998 | Asai et al. | 257/382 |
| 5,801,427 A * | 9/1998 | Shiratake et al. | 257/412 |
| 6,020,641 A * | 2/2000 | Lee et al. | 257/755 |

FOREIGN PATENT DOCUMENTS

| | | | | |
|---|---|---|---|---|
| DE | 42 34 666 A1 | 4/1993 | | |
| JP | 401039064 | * | 2/1989 | 257/755 |
| JP | 404072763 | * | 2/1989 | 257/755 |

* cited by examiner

Primary Examiner—Eddie Lee
Assistant Examiner—Edgardo Ortiz
(74) Attorney, Agent, or Firm—Jones Volentine, L.L.C.

(57) ABSTRACT

A semiconductor device adopting an interlayer contact structure between upper and lower conductive layers and a method of manufacturing the semiconductor device adopting the structure are provided. The lower conductive layer includes a first conductive layer and a first silicide layer stacked together. The upper conductive layer includes a second conductive layer doped with impurities and a second silicide layer stacked together. In the interlayer contact structure, the first and second conductive layers are in direct contact with each other. This decreases the contact resistance between the two conductive layers and improves the electrical properties of the device.

21 Claims, 7 Drawing Sheets

APPARATUS AND MANUFACTURING METHOD FOR SEMICONDUCTOR DEVICE ADOPTING NA INTERLAYER CONTACT STRUCTURE

This application is a continuation of application Ser. No. 08/571,372; filed on Dec. 13, 1995.

BACKGROUND OF THE INVENTION

The present invention relates to a semiconductor memory device and a method of manufacturing the same. More particularly, the present invention relates to a semiconductor device adopting an interlayer contact structure for improving the electrical characteristics of the device by reducing the contact resistance between upper and lower conductive layers thereof, and a method of manufacturing the same.

As the integration of semiconductor devices increases, the formation of conductive layers having a multi-layered structure becomes more prevalent. In doing so, the contact characteristic (i.e., resistance) between such conductive layers has an important effect on the overall electrical characteristics of the semiconductor device. Recently, a conductive layer having a polycide structure (silicide atop polysilicon) has been employed to reduce sheet resistance.

FIGS. 1A–1D illustrate a conventional method for making an interlayer contact between upper and lower conductive layers, each having the above-mentioned polycide structure, of a semiconductor memory device.

Figure 1A:
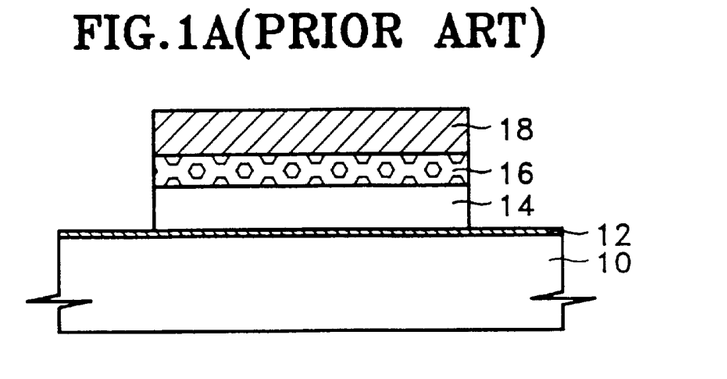
FIGS. 1A–1D are section views illustrating a conventional method of manufacturing a semiconductor device having an interlayer contact structure.
Figure 1B:
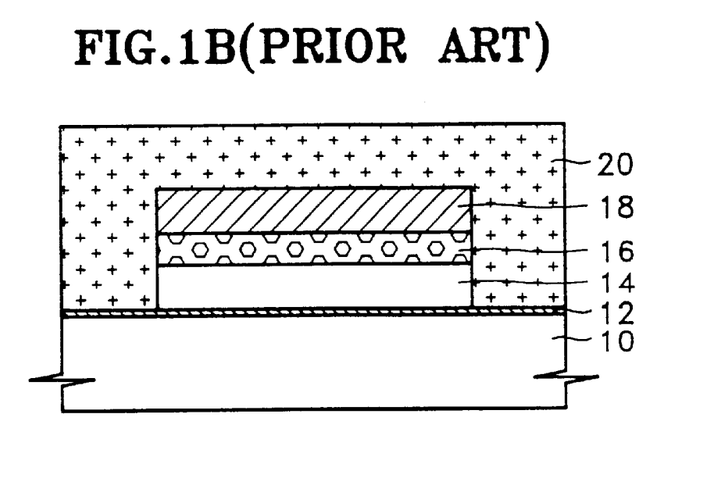
Figure 1C:
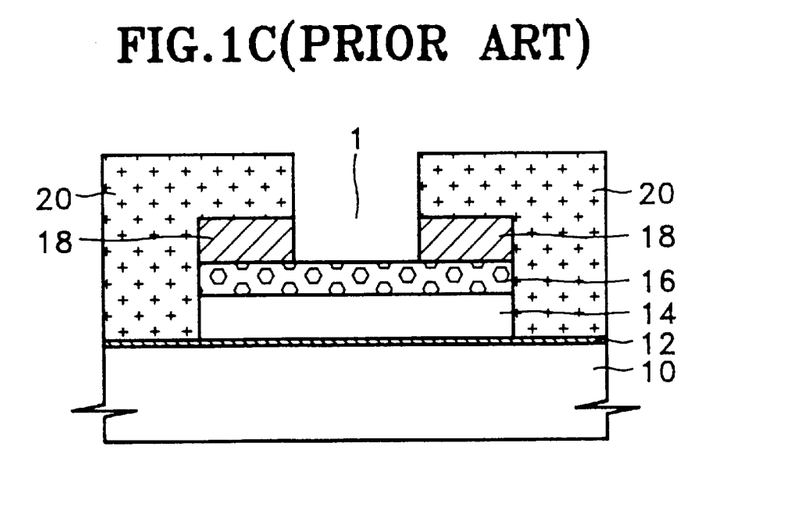

Referring to FIG. 1A, an oxide such as silicon oxide ($SiO_2$) is deposited on a semiconductor substrate 10 to form a gate oxide layer 12. Then, a first polysilicon layer 14 doped with phosphorus ions, a first tungsten silicide ($WSi_x$) layer 16 and a capping layer 18 are sequentially deposited on the gate oxide layer 12, and are then patterned to form a lower conductive layer out of the first polysilicon layer 14 and the first tungsten silicide layer 16. The capping layer 18 is generally formed out of an oxide or nitride material. Then, an insulating material such as boro-phosphorus silicate glass is deposited over the first tungsten silicon layer 16, and is reflowed to form an interlayer insulating layer 20 having a planer surface (see FIG. 1B). A contact hole 1 is then formed by partially etching the interlayer insulating layer 20 and the capping layer 18 to expose the first tungsten silicide layer 16 (see FIG. 1C). Subsequently, a second polysilicon layer 22 doped with phosphorus ions and a second tungsten silicide layer 24 are stacked over the interlayer insulating layer 20 and the second tungsten silicon layer to form an upper conductive layer. The contact layer is formed such that the second polysilicon layer 22 is in contact with first tungsten silicide layer 16 (see FIG. 1D).

Figure 1D:
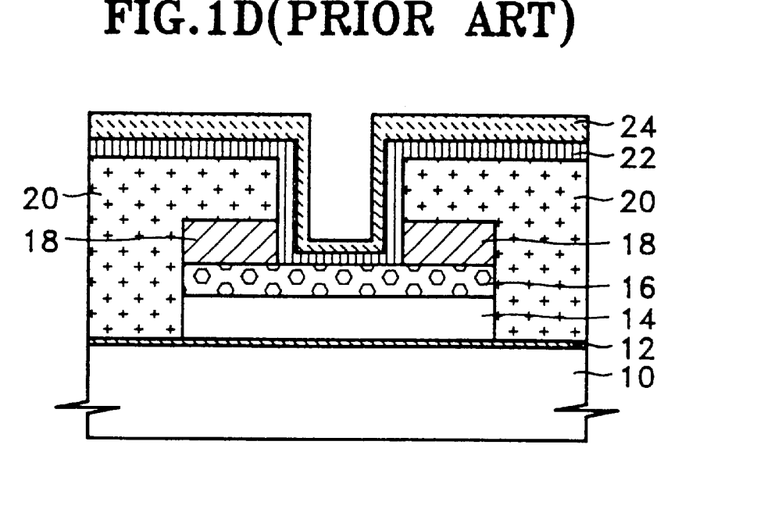

In this conventional interlayer contact structure, however, where the first tungsten silicide layer 16 directly contacts the second polysilicon layer 22, and the second polysilicon layer 22 is doped with phosphorus ions, the contact resistance increases for two reasons. First, the phosphorus ions doped in the second polysilicon layer 22 diffuse toward the first tungsten silicide layer 16, and serve to decrease the impurity concentration at the interface between the second polysilicon layer 22 and the first tungsten silicon layer. Secondly, after forming the contact hole 1 and prior to depositing the second polysilicon layer 22, a natural oxide layer such as tungsten oxide ($WO_3$) or silicon oxide ($SiO_2$) forms on the surface of first tungsten silicide layer 16.

Figure 2:
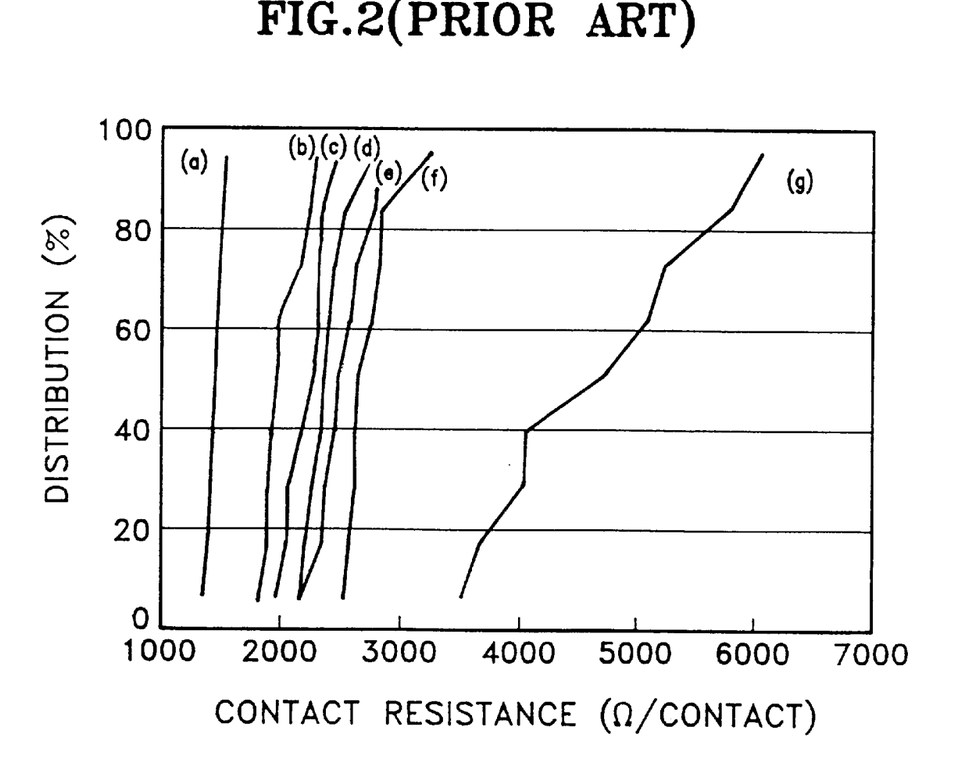
FIG. 2 is a graph showing contact resistance distribution characteristics of several sample wafers employing the conventional interlayer contact structure.

FIG. 2 shows the contact resistance distribution characteristics measured in seven sample wafers (a) through (g) that adopt the conventional interlayer contact structure (FIG. 1D). Here, it can be seen that the contact resistance of the conventional contact structure runs well above 1 kΩ per contact (where the contact size is about 0.4–0.48 $mm^2$) Such a high contact resistance negatively affects the operation speed and can even prevent proper device operation if it goes beyond about 10 kW.

Figure 3:
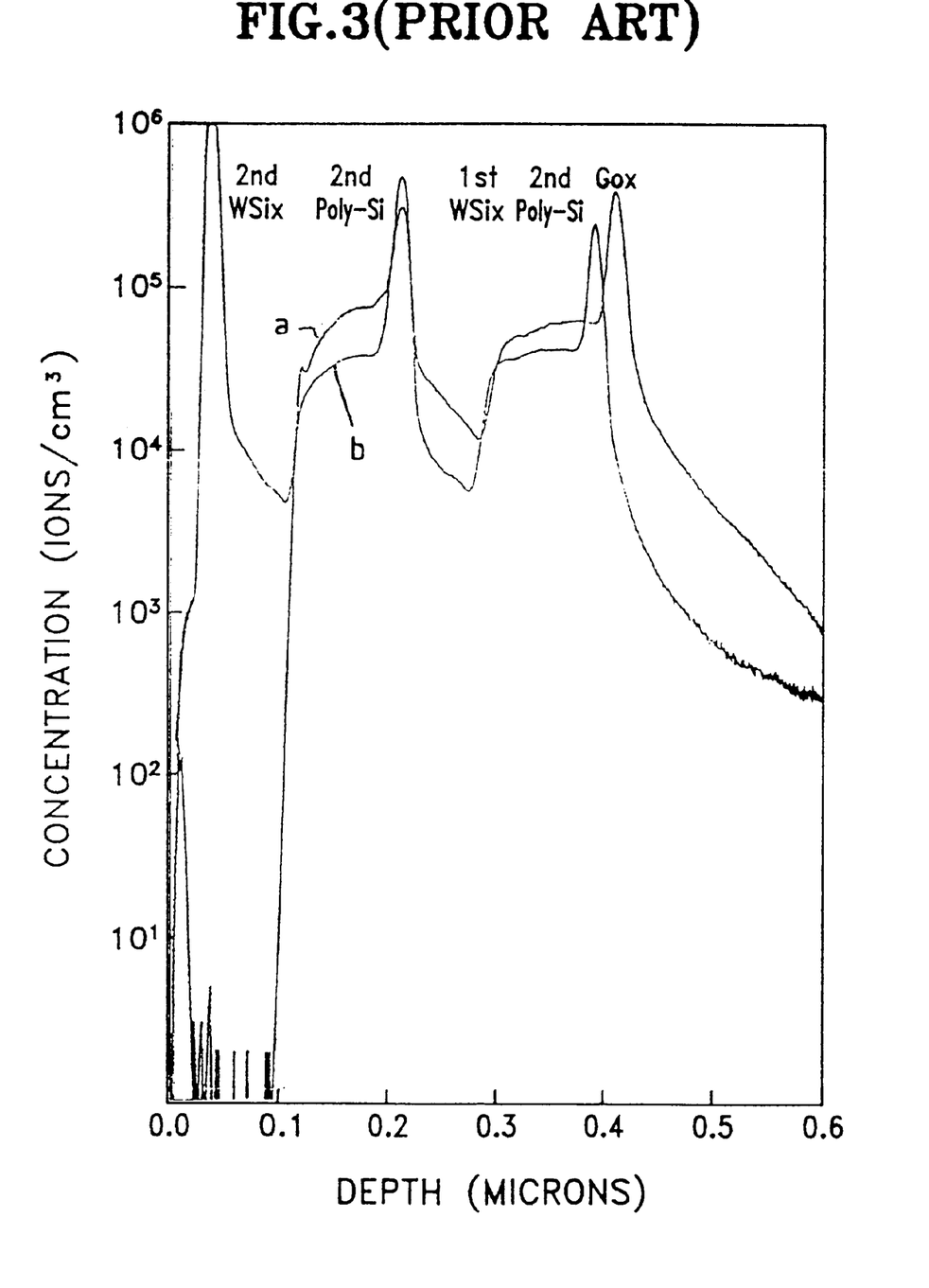
FIG. 3 is a graph showing the impurities distribution in the conventional interlayer contact structure, before and after annealing.

FIG. 3 shows the impurities distribution in the contact structure described above, both before (a) and after (b) annealing. Concentrations are shown for the first polysilicon layer 14, the first tungsten silicide layer 16, the second polysilicon layer 22, the second tungsten silicide layer 24, and at every interface of these layers. Here, a low concentration of impurities is evident between the first tungsten silicide layer 16 and the second polysilicon layer 22.

SUMMARY OF THE INVENTION

Therefore, it is an object of the present invention to provide a semiconductor device having an interlayer contact structure for improving contact characteristics between upper and lower conductive layers of the semiconductor device, by lowering the contact resistance thereof.

It is another object of the present invention to provide a method of manufacturing the semiconductor device with the interlayer contact structure.

To achieve the above first, there is provided an interlayer contact structure in a semiconductor device, comprising: a first conductive layer; a first silicide layer formed over the first conductive layer; a second conductive layer doped with impurities; and a second silicide layer formed over second conductive layer, wherein the first and second conductive layers directly contact each other.

To achieve the above second object, there is provided a method of manufacturing an interlayer contact structure in a semiconductor device, the method comprising the steps of: forming a first conductive layer; forming a first silicide layer over the first conductive layer; forming an interlayer insulating layer over the first silicide layer; forming a contact hole by partially etching the interlayer insulating layer; partially etching the first silicide layer where the first silicide layer is exposed through the contact hole; forming a second conductive layer doped with impurities over the first conductive layer, the first silicide layer, and the interlayer insulating layer; and forming a second silicide layer over the second conductive layer.

It is preferable that the first and second conductive layers be made of amorphous silicon or polysilicon. It is further preferable that the first and second silicide layers be made of a material selected from the silicide group of tungsten silicide ($WSi_2$), titanium silicide ($TiSi_2$), molybdenum silicide ($MoSi_2$), and tantalum silicide ($TaSi_2$), and that the employed impurities be phosphorus or arsenic ions.

In the above method, it is preferable that the step of partially etching the first silicide layer be performed using an isotropic etching method. It is further preferable that the isotropic etching method be a wet etching method using an etchant containing $NH_4OH$, $H_2O_2$ and $H_2O$, or a dry etching method using $Cl_2/SF_6$ gas. During the step of partially etching the first silicide layer, the first silicide layer is etched until the first conductive layer is exposed.

Therefore, according to the semiconductor device adopting the interlayer contact structure and method of manufacturing the same, the electrical properties of the interlayer contact can be improved by lowering the contact resistance between the lower conductive layer having a silicide layer in its uppermost portion and the upper conductive layer having an impurities-doped conductive layer in its lowermost portion.

BRIEF DESCRIPTION OF THE DRAWINGS

The above objects and advantages of the present invention will become more apparent by describing in detail preferred embodiments with reference to the attached drawings in which.

DETAILED DESCRIPTION OF THE PREFERRED EMBODIMENTS OF THE INVENTION

First Preferred Embodiment

Figure 4:
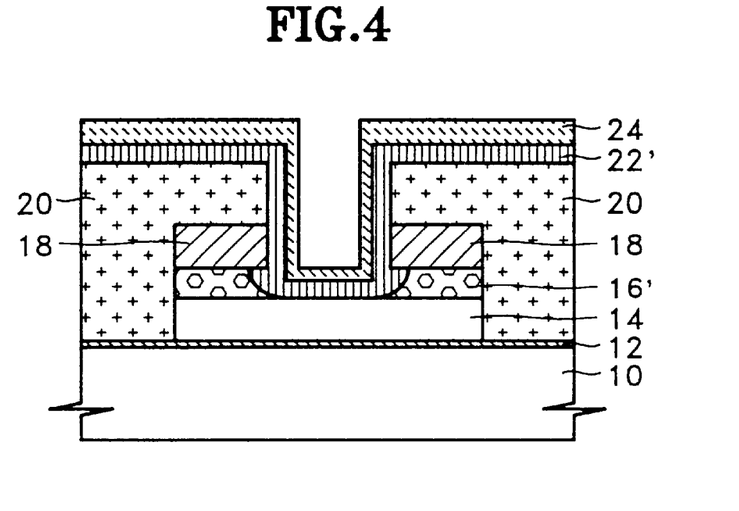
FIG. 4 is a sectional view showing a semiconductor device with an interlayer contact structure manufactured according to a first preferred embodiment of the present invention.

FIG. 4 is a sectional view showing a semiconductor device with an interlayer contact structure manufactured according to a first preferred embodiment of the present invention.

As shown in FIG. 4, the interlayer contact structure includes a semiconductor substrate 10, a gate insulating layer 12, a first conductive layer 14, a first silicide layer 16', a capping layer 18, an interlayer insulating layer 20, a second conductive layer 22', and a second silicide layer 24. In this structure, the first conductive layer 14 and first silicide layer 16' form a lower conductive layer, and the second conductive layer 22' and second silicide layer 24 form an upper conductive layer. The second conductive layer 22' (of the upper conductive layer) is preferably in direct contact with the first silicide layer 16' (of the lower conductive layer). Here, the first and second conductive layers 14 and 22' are preferably each about 1,000 Å in thickness, while the first and second silicide layers 16' and 24 are preferably each about 1,500 Å in thickness.

The second conductive layer 22' is preferably made of a conductive substance, e.g., polysilicon doped with impurities. Although phosphorus ions are preferably used as the impurities for doping second conductive layer 22', the impurities may also be arsenic ions, or any other acceptable substance. In addition, the second conductive layer 22' may also be made of amorphous silicon rather than polysilicon.

The first and second silicide layers 16' and 24 are both preferably made of tungsten silicide ($WSi_x$). In the present invention, however, they may also be made of titanium silicide ($TiSi_2$), molybdenum silicide ($MoSi_2$), tantalum silicide ($TaSi_2$), or ant other acceptable substance.

To create an improved contact area between second conductive layer 22' and the lower conductive layer, comprising the first contact layer 14 and the first silicide layer 16', a hole is made in the first silicide layer 16' that is larger than a contact hole 1 in the interlayer insulating layer 20 and the capping layer 18. This also reduces the contact resistance between the various conductive layers.

Although FIG. 4 depicts a semiconductor device with an interlayer contact structure formed directly between the first and second conductive layers 14 and 22', a preferred embodiment may be formed such that a somewhat thinner portion of first silicide layer 16' remains between the first and second conductive layers.

FIGS. 5A–5E illustrate a method of manufacturing a semiconductor device having an interlayer contact structure according to a first preferred embodiment of the present invention.

Figure 5A:
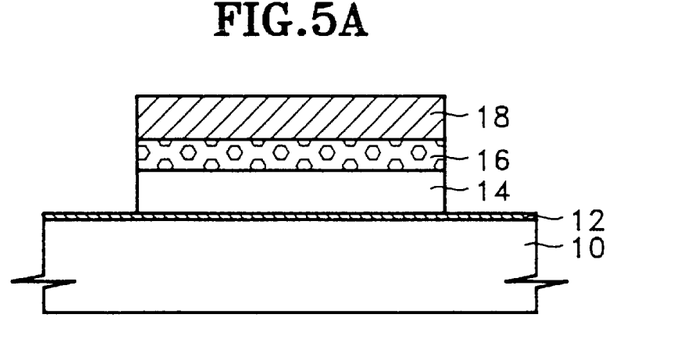
FIGS. 5A–5E are section views illustrating a method of manufacturing the semiconductor device with an interlayer contact structure according to the first preferred embodiment of the present invention.

FIG. 5A shows the step of forming the lower conductive layer. The step comprises the sub-steps of forming a gate insulating layer 12 by depositing an insulating substance such as silicon dioxide on a semiconductor substrate 10 and forming a lower conductive layer by sequentially stacking the first conductive layer 14, the first silicide layer 16, and a capping layer 18 over a gate insulating layer 12. The lower conductive layer comprises the first conductive layer 14 and the first silicide layer 16, which, along with the capping layer, have been patterned. The first conductive layer 14 is preferably formed by depositing polysilicon doped with phosphorus ions to a thickness of about 1,000Å. The first silicide layer 16 is preferably formed by depositing a silicide such as tungsten silicide to a thickness of about 1,500 Å, although titanium silicide ($TiSi_2$), molybdenum silicide ($MoSi_2$), tantalum silicide ($TaSi_2$), or any other suitable material may be used. Capping layer 18 is preferably formed of an insulating material such as an oxide or nitride, but may be omitted under certain circumstances since it does not directly affect the device characteristics.

Figure 5B:
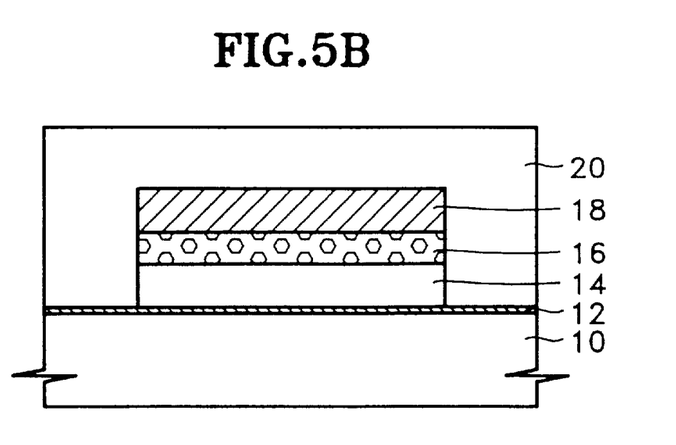

FIG. 5B shows the step of forming an interlayer insulating layer 20. After depositing an insulating material such as boro-phosphorus silicate glass over the first conductive layer 14 and the first silicide layer 16, the insulating material is reflowed, to form the interlayer insulating layer 20, having a planarized surface.

Figure 5C:
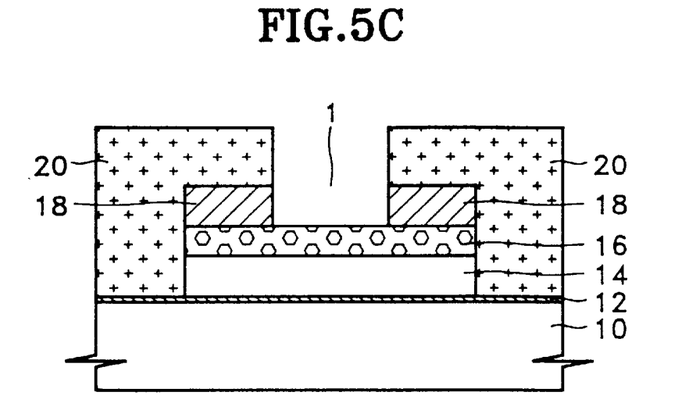

FIG. 5C shows the step of forming a contact hole 1 in the first preferred embodiment. The interlayer insulating layer 20 and the capping layer 18 are partially etched using an anisotropic etching method such as reactive ion etching. Accordingly, contact hole 1 is formed to exposed first silicide layer 16.

Figure 5D:
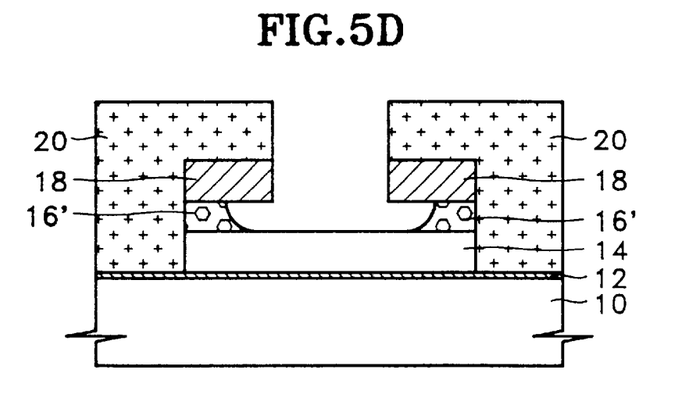
Figure 5E:
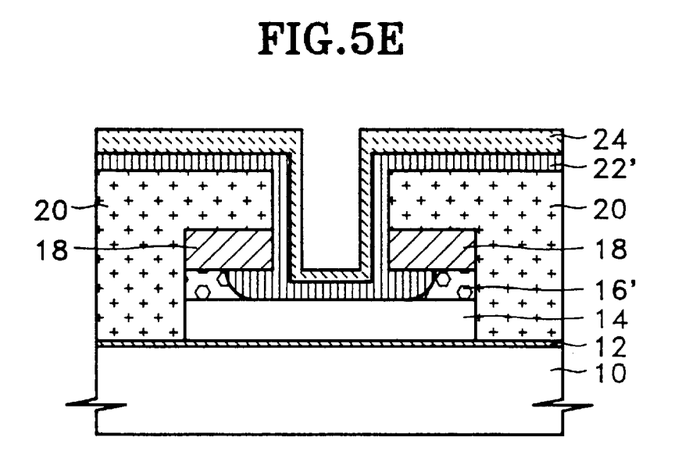

FIG. 5D shows the step of partially etching the first silicide layer 16. In this step. the exposed portion of first silicide layer 16 is partially etched, preferably using isotropic etching. In the first preferred embodiment, first silicide layer 16 is preferably etched through a wet etching method using an etchant comprising $NH_4OH$, $H_2O_2$, and $H_2O$, although a dry etching method using $Cl_2/SF_6$ gas may also be used. By isotropically etching the first silicide layer 16, an area of the first conductive layer 14 is exposed that is larger than the area of contact hole 1. This means that the area of first conductive layer 14 contacting the second conductive layer 22 (formed in the following step, as shown in FIG. 5E) is greater than the corresponding area in a conventional device. This results in a lowered contact resistance, since, as is well known, when the contact area increases, the contact resistance decreases.

FIG. 5E shows the step of forming the upper conductive layer comprising a second conductive layer 22' and a second silicide layer 24. The second conductive layer 22' and the second silicide layer 24 are sequentially deposited over the interlayer insulating layer 20 and the first conductive layer 14. In the first preferred embodiment, polysilicon doped with is impurities is preferably used as the second conductive layer 22', and tungsten silicide is preferably used as the second silicide layer 24. However, the second conductive layer 22' may also comprise amorphous silicon doped with impurities, and the second silicide layer 24 may also comprise titanium silicide ($TiSi_2$), molybdenum silicide ($MoSi_2$), tantalum silicide ($TaSi_2$), or any other acceptable material.

The interlayer contacting method of the first preferred embodiment of the present invention has three advantageous effects. First, the contact resistance decreases since the contacting surface area between the upper and lower conductive layers increases. Second, the first and second conductive layers directly contact each other, which prevents the increase of the contact resistance caused by the diffusion of the impurities included in the second conductive layer into the first silicide layer. Third, the contact resistance further decreases because there no possibility remains for a natural oxide layer to form on the first silicide layer 16.

Second Preferred Embodiment

Figure 6A:
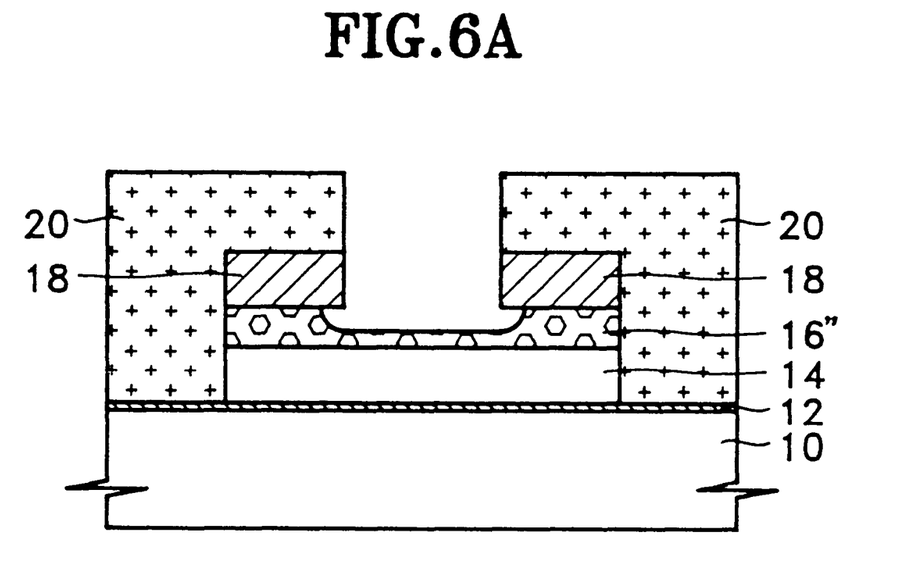
FIGS. 6A and 6B are section views illustrating a method of manufacturing the semiconductor device having an interlayer contact structure according to a second preferred embodiment of the present invention.
Figure 6B:
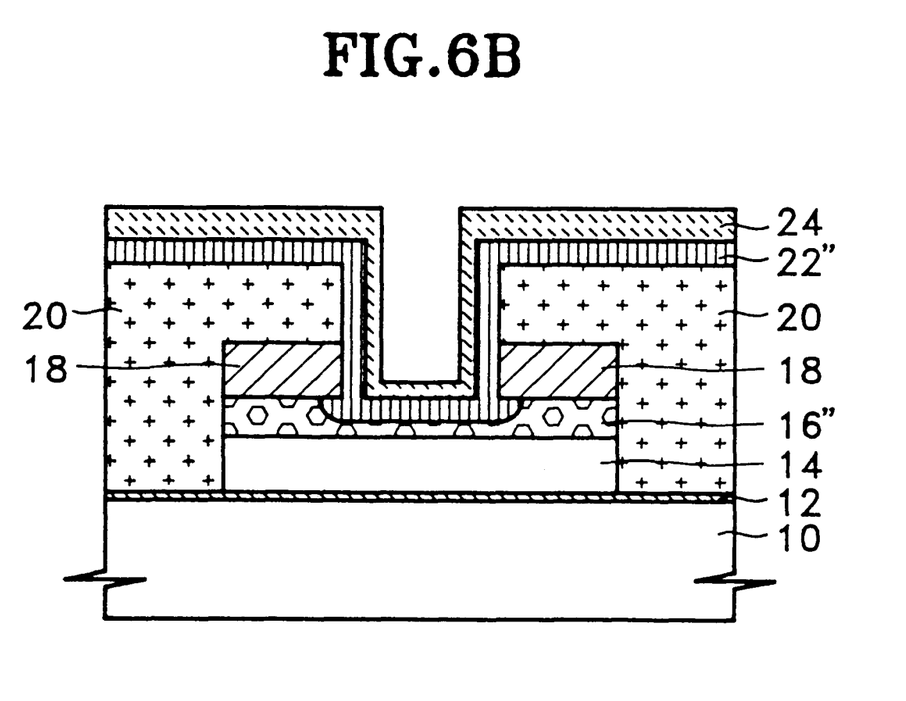

FIGS. 6A and 6B illustrate a method of manufacturing a semiconductor device with an interlayer contact structure according to a second preferred embodiment of the present invention. This embodiment is identical to the first preferred embodiment, described with respect to FIGS. 5A through 5E, except as noted below.

In the first embodiment, after forming the contact hole 1, the first silicide layer 16 is isotropically etched until a portion of the surface of first conductive layer 14 is exposed. In the second preferred embodiment, however, the isotropic etching is performed to a lesser degree, as shown in FIG. 6A, so as to leave a predetermined thickness of the first silicide layer 16" on the first conductive layer 14. In the second preferred embodiment of the current invention, the initial thickness of the first-silicide layer is about 1,500Å, and the etched is thickness is about 500Å.

The subsequent processing of the second preferred embodiment is substantially the same as that for the first embodiment, except that the second conducting layer 22" is thinner at its lowest point and does not abut the first conducting layer. The final resulting structure can be seen with reference to FIG. 6B.

According to the interlayer contacting method of the second preferred embodiment of the present invention, a lower contact resistance than that obtained conventionally can be achieved, since the thickness of silicide layer 16" between first and second conductive layers 14 and 22" is thinner than its initial deposition thickness and the concentration of impurities ions in silicide layer 16" decreases according to its decreased thickness.

Figure 7:
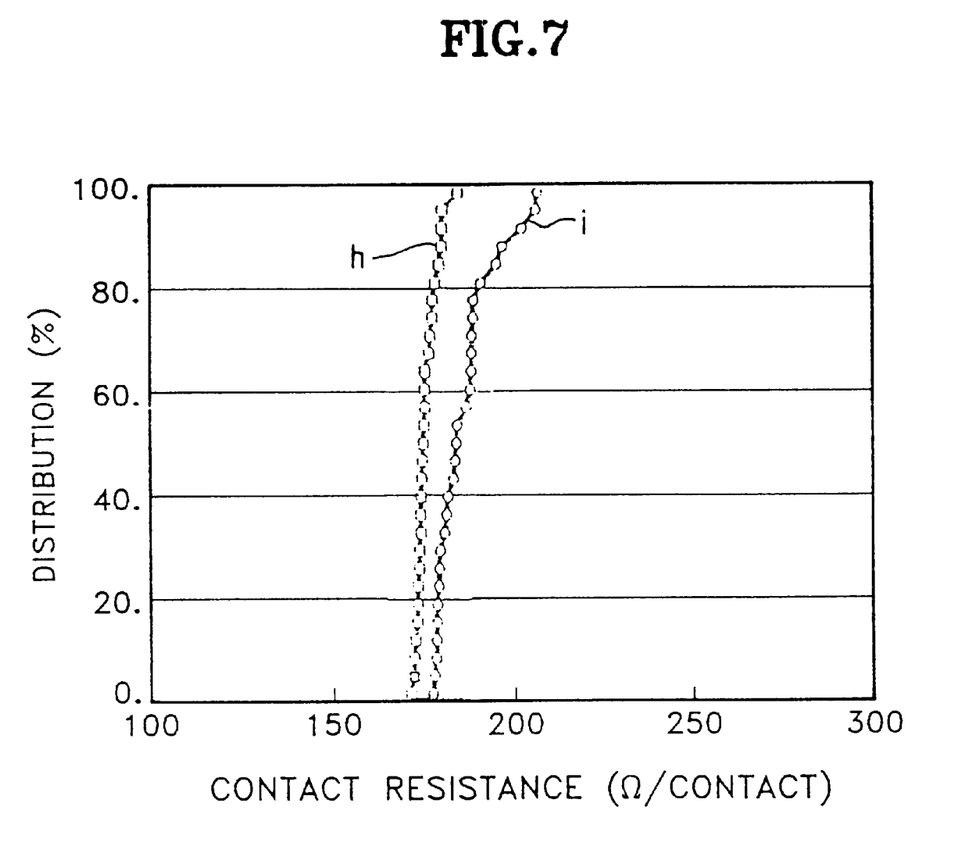
FIG. 7 is a graph showing contact resistance distribution characteristics of two sample wafers employing the interlayer contact structure according to the first preferred embodiment is of the present invention.

FIG. 7 shows the contact resistance distribution characteristics measured in two sample wafers (h) and (i) in which the interlayer contact structure according to the first preferred embodiment of the present invention was employed. Here, it can be seen that the contact resistance between the upper and lower conductive layers is less than that according to the conventional method, which thereby improves the electrical characteristics of the device. As shown in FIG. 3, the contact resistance is well above 1kΩ in the conventional method. But, as shown in FIG. 7, the contact resistance decreases to approximately 200 Ω per contact (where the contact size is about 0.4–0.48 mm$^2$) or less using the method according to the present invention.

Therefore, in the interlayer contact structure and the method of manufacturing the same according to the present invention, the contact resistance between lower and upper conductive layers of a semiconductor memory device decreases dramatically, which thereby improves the electrical properties of the device.

The present invention is not limited to the above-described embodiments. Various changes and modifications may be effected by one having an ordinary skill in the art and remain within the scope of the invention, as defined by the appended claims.

What is claimed is:

1. An interlayer contact structure in a semiconductor device, comprising:
   a stacked lower conductive layer pattern comprising a first doped silicon layer pattern and a first silicide layer pattern formed over the first doped silicon layer pattern;
   an insulating layer formed over the stacked lower conductive layer pattern;
   an opening formed in the insulating layer extending down to the first doped silicon layer pattern, the opening having an undercut formed between the insulating layer and the first silicide layer pattern; and
   a stacked upper conductive layer pattern comprising a second doped silicon layer pattern and a second silicide layer pattern formed over the second doped silicon layer pattern, wherein the second doped silicon layer pattern of the upper conductive layer directly contacts the first doped silicon layer pattern through the opening.

2. The interlayer contact structure in the semiconductor device of claim 1, wherein the first and second silicide layer patterns are each made of a material selected from the group consisting of tungsten silicide ($WSi_2$), titanium silicide ($TiSi_2$), molybdenum silicide ($MoSi_2$), and tantalum silicide ($TaSi_2$).

3. The interlayer contact structure in a semiconductor device of claim 1, wherein the undercut is formed by isotropically etching the first silicide layer pattern.

4. The interlayer contact structure in a semiconductor device of claim 1, further comprising a gate insulating layer under the stacked lower conductive layer pattern.

5. The interlayer contact structure in a semiconductor device of claim 1, wherein the insulating layer comprises silicate glass.

6. The interlayer contact structure in a semiconductor device of claim 1, wherein the insulating layer has a planarized surface that is formed by reflowing the insulating layer.

7. The interlayer contact structure in a semiconductor device of claim 1, further comprising a capping layer over the stacked lower conductive layer pattern.

8. An interlayer contact structure in a semiconductor device, comprising:
   a stacked lower conductive layer pattern comprising a first doped silicon layer pattern and a first silicide layer pattern formed over the first doped silicon layer pattern;
   an insulating layer formed over the stacked lower conductive layer pattern;
   an opening formed in the insulating layer extending partially into the first silicide layer pattern, the opening having an undercut formed between the insulating layer and the first silicide layer pattern; and a stacked upper conductive layer patten comprising a second doped silicon layer pattern and a second silicide layer pattern formed over the second doped silicon layer pattern, wherein the second doped silicon layer pattern of the upper conductive layer directly contacts the first silicide layer pattern having the groove through the opening.

9. The interlayer contact structure in a semiconductor device of claim 8, wherein the first and the second silicide layer patterns each comprise a material selected from the group consisting of tungsten silicide ($WSi_2$), titanium silicide ($TiSi_2$), molybdenum silicide ($MoSi_2$), and tantalum silicide ($TaSi_2$).

10. The interlayer contact structure in a semiconductor device of claim 8, wherein the undercut is formed by isotropically partially etching the first silicide layer pattern.

11. The interlayer contact structure in a semiconductor device of claim 8, further comprising a gate insulating layer under the stacked lower conductive layer pattern.

12. The interlayer contact structure in a semiconductor device of claim 8, wherein the insulating layer comprises silicate glass.

13. The interlayer contact structure in a semiconductor device of claim 8, wherein the insulating layer has a planarized surface that is formed by reflowing the insulating layer.

14. The interlayer contact structure in a semiconductor device of claim 8, further comprising a capping layer over the stacked lower conductive layer pattern.

15. An interlayer contact structure in a semiconductor device, comprising:
 a stacked lower conductive layer pattern comprising a first doped silicon layer pattern and a first silicide layer pattern formed over the first doped silicon layer patten;
 a capping layer formed over the stacked lower conductive layer pattern, the capping layer being formed of an insulating material;
 an insulating layer formed over the capping layer and the stacked lower conductive layer pattern, the insulating layer formed of silicate glass and having a planarized surface;
 an opening formed in the insulating layer extending down to the first doped silicon layer pattern, the opening having an undercut formed between the insulating layer pattern and the first silicide layer pattern; and
 a stacked upper conductive layer pattern comprising a second doped silicon layer pattern and a second silicide layer pattern formed over the second doped silicon layer pattern, wherein the second doped silicon layer pattern of the upper conductive layer directly contacts the first doped silicon layer pattern through the opening.

16. The interlayer contact structure in a semiconductor device of claim 15, wherein the first and second silicide layer patterns each comprise a material selected from the group consisting of tungsten silicide ($WSi_2$), titanium silicide ($TiSi_2$), molybdenum silicide ($MoSi_2$), and tantalum silicide ($TaSi_2$).

17. The interlayer contact structure in a semiconductor device of claim 15, wherein the undercut is formed by isotropically etching the first silicide layer.

18. The interlayer contact structure in a semiconductor device of claim 15, further comprising a gate insulating layer under the stacked lower conductive layer pattern.

19. An interlayer contact structure in a semiconductor device, comprising:
 a gate insulating layer;
 a stacked lower conductive layer pattern formed over the gate insulating layer, the stacked lower conductive layer comprising a first doped silicon layer pattern and a first silicide layer pattern formed over the first doped silicon layer pattern;
 a capping layer formed over the stacked lower conducive layer pattern;
 an insulating layer formed over the capping layer and the stacked lower conductive layer pattern, the insulating layer formed of silicate glass and having a planarized surface;
 an opening formed in the insulating layer extending down to the first doped silicon layer pattern, the opening having an undercut formed between the insulating layer pattern and the first silicide layer pattern; and
 a stacked upper conducive layer pattern comprising a second doped silicon layer pattern and a second silicide layer pattern formed over the second doped silicon layer pattern, wherein the second doped silicon layer pattern through the opening.

20. An interlayer contact structure in a semiconductor device, comprising:
 a stacked lower conductive layer pattern comprising a first doped silicon layer pattern and a first silicide layer pattern formed over the first doped silicon layer pattern;
 an insulating layer formed over the stacked lower conductive layer pattern;
 an opening formed in the insulating layer extending down to the first doped silicon layer pattern, the opening having an undercut formed between the insulating layer pattern and the first silicide layer pattern; and
 an upper doped silicon layer pattern formed on the insulating layer and directly contacting the first doped silicon layer pattern through the opening.

21. An interlayer contact structure in a semiconductor device, comprising:
 a stacked lower conductive layer pattern comprising a first doped silicon layer pattern and a first silicide layer pattern formed over the first doped silicon layer pattern;
 an insulating layer formed over the stacked lower conductive layer pattern;
 an opening formed in the insulating layer extending partially into the first silicide layer pattern, the opening having an undercut formed between the insulating layer and the first silicide layer pattern; and
 an upper doped silicon layer pattern formed on the insulating layer and directly contacting the first silicide layer pattern having the groove through the opening.

* * * * *